United States Patent
Adams et al.

(10) Patent No.: US 10,120,957 B2
(45) Date of Patent: **\*Nov. 6, 2018**

(54) STORED DATA WITH TEMPORAL PROXIMITY ANALYSIS FOR VERY LARGE SCALE DATA WITH VERY LOW BUILT IN LATENCY

(71) Applicant: International Business Machines Corporation, Armonk, NY (US)

(72) Inventors: Samuel Scott Adams, Rutherfordton, NC (US); Suparna Bhattacharya, Bangalore (IN); Robert R. Friedlander, Southbury, CT (US); James R. Kraemer, Santa Fe, NM (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/612,473

(22) Filed: Jun. 2, 2017

(65) Prior Publication Data

US 2017/0270220 A1 Sep. 21, 2017

Related U.S. Application Data

(63) Continuation of application No. 14/865,929, filed on Sep. 25, 2015, now Pat. No. 9,703,894.

(51) Int. Cl.
*G06F 12/00* (2006.01)
*G06F 17/30* (2006.01)
(Continued)

(52) U.S. Cl.
CPC .......... *G06F 17/30982* (2013.01); *G06F 9/34* (2013.01); *G06F 12/0692* (2013.01);
(Continued)

(58) Field of Classification Search
CPC .. G06F 17/30982; G06F 12/0692; G06F 9/34; G06F 17/30324; G06F 17/3033; G06F 2212/656
See application file for complete search history.

(56) References Cited

U.S. PATENT DOCUMENTS 8,041,517 B2 10/2011 Thayer et al.
2007/0113158 A1 5/2007 Fischer et al.
(Continued)

OTHER PUBLICATIONS

Shinde, R., et al., "Similarity Search and Locality Sensitive Hashing Using Ternary Content Addressable Memories", Proceedings of the 2010 ACM SIGMOD/PODS Conference, Jun. 6-11, 2010, pp. 1-13.

(Continued)

*Primary Examiner* — Mark A Giardino, Jr.
(74) *Attorney, Agent, or Firm* — Fleit Gibbons Gutman Bongini Bianco PL; Jon A. Gibbons

(57) ABSTRACT

A system comprises a hashing logic, which executes instructions to convert raw data into a first logical address and payload data, where the first logical address describes metadata about the payload data. A hardware translation unit executes instructions to translate the first logical address into a first physical address on a storage device. A hardware load/storage unit stores the first logical address and the payload data at the first physical address on the storage device. A content addressable store is associated with a reference to the logical addressed data in this location addressable high dimensional store, where the content addressable store is searched for the desired content word using at least one temporal attribute to retrieve the corresponding references with low latency. A hardware exclusive OR (XOR) unit compares two logical address vectors to derive a Hamming distance between the two logical address vectors.

20 Claims, 6 Drawing Sheets

(51) Int. Cl.
*G06F 12/06* (2006.01)
*G06F 15/80* (2006.01)
*G06F 9/34* (2018.01)
*G06F 13/00* (2006.01)
*G06F 13/28* (2006.01)

(52) U.S. Cl.
CPC ...... *G06F 15/8053* (2013.01); *G06F 17/3033* (2013.01); *G06F 17/30324* (2013.01); *G06F 2212/656* (2013.01)

(56) References Cited

U.S. PATENT DOCUMENTS

| | | |
|---|---|---|
| 2012/0137059 A1 | 5/2012 | Yang et al. |
| 2014/0344292 A1 | 11/2014 | Friedlander et al. |
| 2014/0344548 A1 | 11/2014 | Friedlander et al. |

OTHER PUBLICATIONS

Non-Final Office Action dated Oct. 27, 2016, received for U.S. Appl. No. 14/865,929.
List of IBM Patents or Patent Applications Treated as Related.

STORED DATA WITH TEMPORAL PROXIMITY ANALYSIS FOR VERY LARGE SCALE DATA WITH VERY LOW BUILT IN LATENCY

BACKGROUND

The present disclosure relates to the field of computers, and specifically to the use of computers when storing data. Still more particularly, the present disclosure relates to analyzing and/or evaluating stored data.

Data storage includes the storage of data that describes a particular event, entity, etc. For example, data may describe attributes of a person, place or thing, and/or data may provide details about a commercial transaction (e.g., number of items of a particular type sold at a certain store, the costs of the items, etc.). Such data is stored in a memory structure known as a database, which may be physical or virtual. More specifically, computing proximity in highly dimensional, multi event data is a known problem and even more so with large volumes of data and low acceptable latency.

SUMMARY

Disclosed is a solution to the known problem of computing proximity in highly dimensional, multi event data and the difficulties of doing so with large volumes of data and low acceptable latency. The use of temporal proximity, time distance relative to some common event set, is useful to the analytical outcome of large value in many disciplines including healthcare, marketing, finance, ecology, cognitive understanding, etc.

This solution is to optimize fine grained context addressability in highly dimensional environments using ternary content-addressable memory (TCAM) with hybrid memory and storage architectures to allow temporal analytics based on the intersected union of two or more sets of Hamming distances in the architecture described below. This will vastly improve the speed that such temporal analytics can be done as scale. The highly dimensional data is stored on a TCAM, sparse silicon or other similar related device, with data incorporated into the Kanerva address as described. A temporal event anchor or set of anchors is laid down at the center of the Hamming space. This is compared to the temporal space of events in question. The intersection those spaces is the result set of interest. Note that coupled overlaid addressing may be needed to provide associated frames of reference—example patient outcomes mapped to relevant treatment start.

Disclosed is a computer program product, method, and content addressable memory system, for retrieving data from a content addressable memory system having a location addressable high-dimensional store and a plurality of content addressable store levels each is associated with a reference to data in the location addressable high dimensional store. The method begins with mapping the location addressable high-dimensional store to a sparse distributed memory space. Next a content addressable store level is searched for a desired content word using at least one temporal attribute. Data is retrieved from the sparse distributed memory space via the location addressable high-dimensional store which has been mapped, using data reference associated with the desired content word if the desired content word is found. Finally, the data that has been retrieved from the sparse distributed memory space is analyzed.

The analysis includes using a hashing logic to convert the data retrieved into a first logical address and payload data. A hardware translation unit translates the first logical address into a first physical address on a storage device. A hardware exclusive OR (XOR) unit compares a first address vector for the first logical address to a second address vector for a second logical address to derive a Hamming distance between the first and second logical addresses. The hardware retrieval unit fetches other payload data that is stored at a second physical address whose second logical address is within a predefined Hamming distance from the first logical address, wherein a Hamming distance between the first logical address and the second logical address is derived by the hardware XOR unit.

The details of the preferred embodiments of the invention, both as to its structure and operation, are described below in the Detailed Description section in reference to the accompanying drawings. The Summary is intended to identify key features of the claimed subject matter, but it is not intended to be used to limit the scope of the claimed subject matter.

BRIEF DESCRIPTION OF THE DRAWINGS

The accompanying figures wherein reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

As required, detailed embodiments are disclosed herein; however, it is to be understood that the disclosed embodiments are merely examples and that the systems and methods described below can be embodied in various forms. Therefore, specific structural and functional details disclosed herein are not to be interpreted as limiting, but merely as a basis for the claims and as a representative basis for teaching one skilled in the art to variously employ the present subject matter in virtually any appropriately detailed structure and function. Further, the terms and phrases used herein are not intended to be limiting, but rather, to provide an understandable description of the concepts.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Over All System

Figure 1:
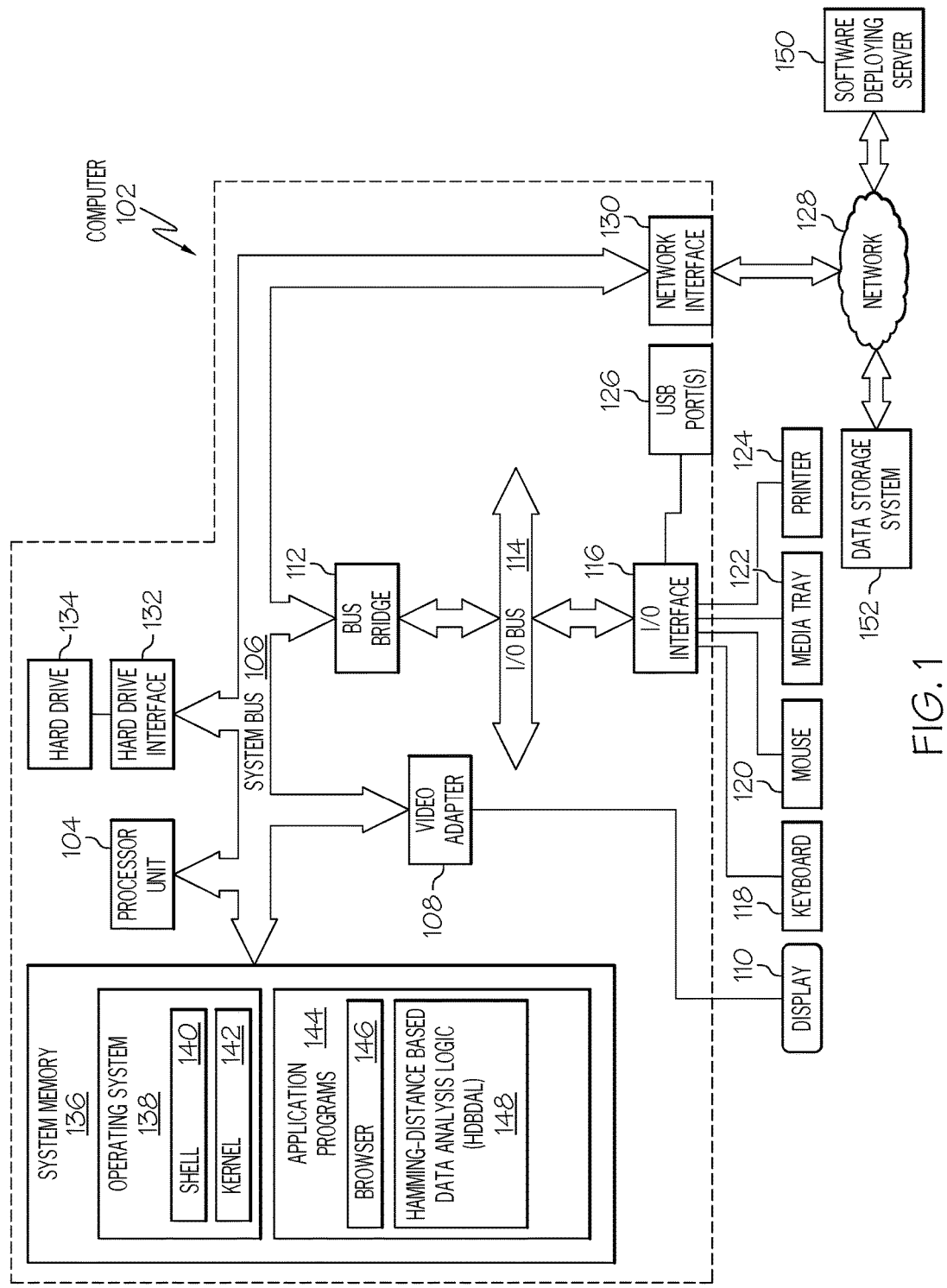
FIG. 1 depicts an exemplary system and network in which the present disclosure may be implemented.

With reference now to the figures, and in particular to FIG. 1, there is depicted a block diagram of an exemplary system and network that may be utilized by and in the implementation of the present invention. Note that some or all of the exemplary architecture, including both depicted hardware and software, shown for and within computer 102 may be utilized by software deploying server 150 and/or a data storage system 152.

Exemplary computer 102 includes a processor 104 that is coupled to a system bus 106. Processor 104 may utilize one or more processors, each of which has one or more processor cores. A video adapter 108, which drives/supports a display 110, is also coupled to system bus 106. System bus 106 is coupled via a bus bridge 112 to an input/output (I/O) bus 114. An I/O interface 116 is coupled to I/O bus 114. I/O interface 116 affords communication with various I/O devices, including a keyboard 118, a mouse 120, a media tray 122 (which may include storage devices such as CD-ROM drives, multi-media interfaces, etc.), a printer 124, and external USB port(s) 126. While the format of the ports connected to I/O interface 116 may be any known to those skilled in the art of computer architecture, in one embodiment some or all of these ports are universal serial bus (USB) ports.

As depicted, computer 102 is able to communicate with a software deploying server 150, using a network interface 130. Network interface 130 is a hardware network interface, such as a network interface card (NIC), etc. Network 128 may be an external network such as the Internet, or an internal network such as an Ethernet or a virtual private network (VPN).

A hard drive interface 132 is also coupled to system bus 106. Hard drive interface 132 interfaces with a hard drive 134. In one embodiment, hard drive 134 populates a system memory 136, which is also coupled to system bus 106. System memory is defined as a lowest level of volatile memory in computer 102. This volatile memory includes additional higher levels of volatile memory (not shown), including, but not limited to, cache memory, registers and buffers. Data that populates system memory 136 includes computer 102's operating system (OS) 138 and application programs 144.

OS 138 includes a shell 140, for providing transparent user access to resources such as application programs 144. Generally, shell 140 is a program that provides an interpreter and an interface between the user and the operating system. More specifically, shell 140 executes commands that are entered into a command line user interface or from a file. Thus, shell 140, also called a command processor, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 142) for processing. Note that while shell 140 is a text-based, line-oriented user interface, the present invention will equally well support other user interface modes, such as graphical, voice, gestural, etc.

As depicted, OS 138 also includes kernel 142, which includes lower levels of functionality for OS 138, including providing essential services required by other parts of OS 138 and application programs 144, including memory management, process and task management, disk management, and mouse and keyboard management.

Application programs 144 include a renderer, shown in exemplary manner as a browser 146. Browser 146 includes program modules and instructions enabling a world wide web (WWW) client (i.e., computer 102) to send and receive network messages to the Internet using hypertext transfer protocol (HTTP) messaging, thus enabling communication with software deploying server 150 and other computer systems.

Application programs 144 in computer 102's system memory (as well as software deploying server 150's system memory) also include a Hamming-Distance Based Data Analysis Logic (HDBDAL) 148. HDBDAL 148 includes code for implementing the processes described below, including those described in FIGS. 2-5. In one embodiment, computer 102 is able to download HDBDAL 148 from software deploying server 150, including in an on-demand basis, wherein the code in HDBDAL 148 is not downloaded until needed for execution. Note further that, in one embodiment of the present invention, software deploying server 150 performs all of the functions associated with the present invention (including execution of HDBDAL 148), thus freeing computer 102 from having to use its own internal computing resources to execute HDBDAL 148.

The data storage system 152 stores a set of data. This data may be for a particular enterprise, a particular project, a particular owner of the data, etc. As described herein, the data is stored using a logical address that describes attributes of the payload data.

Note that the hardware elements depicted in computer 102 are not intended to be exhaustive, but rather are representative to highlight essential components required by the present invention. For instance, computer 102 may include alternate memory storage devices such as magnetic cassettes, digital versatile disks (DVDs), Bernoulli cartridges, and the like. These and other variations are intended to be within the spirit and scope of the present invention.

Logical to Physical Mapping

Figure 2:
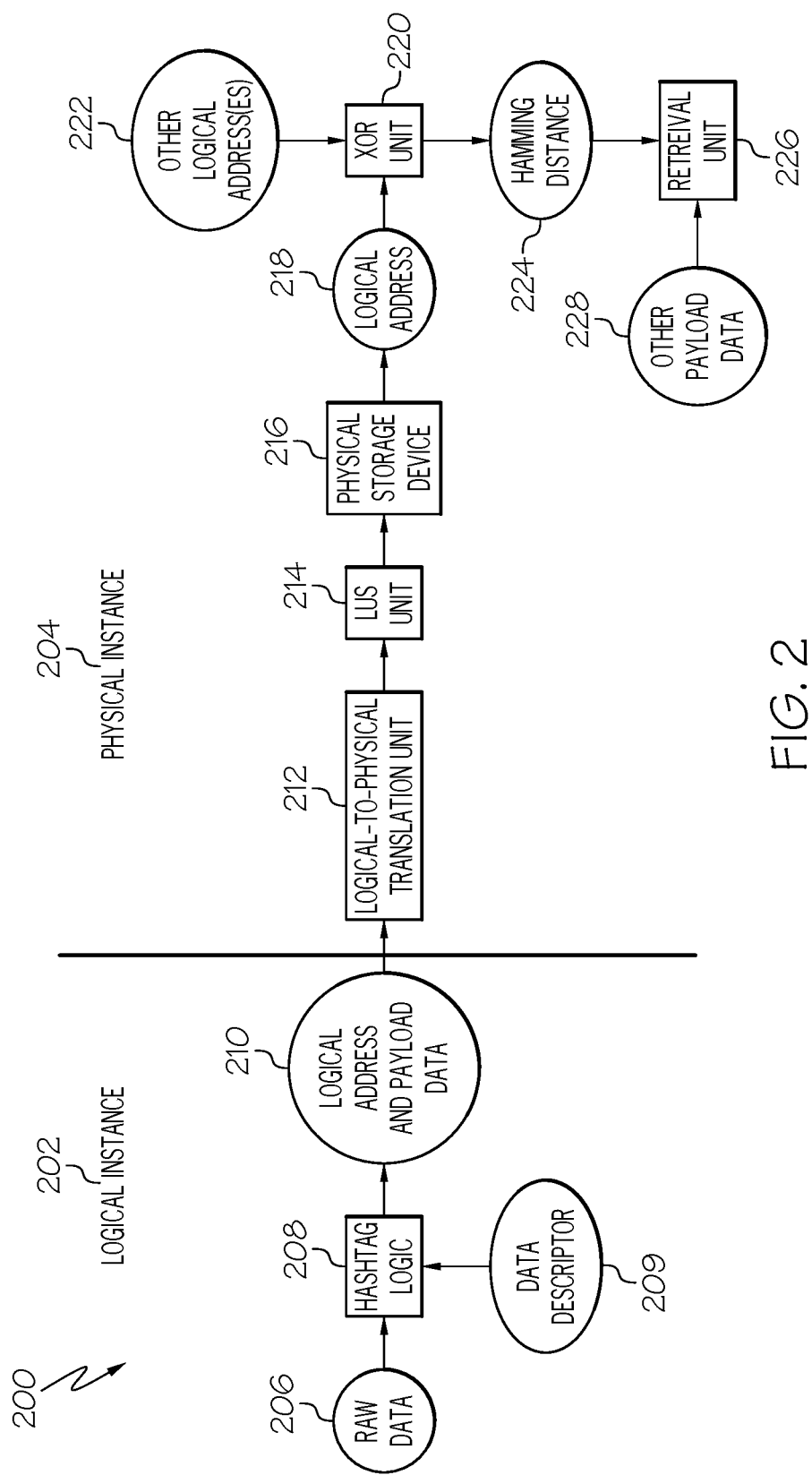
FIG. 2 illustrates an exemplary system in which data is hashed and retrieved in accordance with one embodiment of the present invention.

With reference now to FIG. 2, an exemplary system 200 in which data is hashed and retrieved in accordance with one embodiment of the present invention is presented. As depicted, system 200 comprises a logical instance 202 and a physical instance 204, in which data and addresses are depicted within circles, and processing logic is depicted within squares. The logical instance 202 includes software logic, such as hashing logic 208, which can exist purely in software, including software HDBDAL 148 that is running on a computer such as computer 102 shown in FIG. 1, or it may be a combination of software, firmware, and/or hardware in a cloud or other network of shared resources.

Physical instance 204 is made up primarily of hardware devices, such as elements 212, 214, 216, 220, and 226 depicted in FIG. 2. In one embodiment, all hardware elements depicted in physical instance 204 are on a single chip, which increases the speed of the processes described herein.

As depicted within logical instance 202, raw data 206 is first sent to a hashing logic 208. Note that while hashing logic 208 is shown as part of the logical instance 202, and thus is executed in software, in one embodiment hashing logic 208 is a dedicated hardware logic, which may be part of the physical instance 204.

The raw data 206 is data that is received from a data generator or a data source. For example, raw data 206 may be a physical measurement of heat, wind, radiation, etc.; or medical data such as medical laboratory values; or sales figures for a particular store; or sociological data describing a particular population; etc. Initially, the raw data 206 is merely a combination of characters (i.e., letters and/or numbers and/or other symbols). The hashing logic 208, however, receives information about the raw data from a data descriptor 209. Data descriptor 209 is data that describes the raw data 206. In one embodiment, data descriptor 209 is generated by the entity that generated the raw data 206. For example, if the raw data 206 are readings from a mass spectrometer in a laboratory, logic in the mass spectrometer includes self-awareness information, such as the type of raw data that this particular model of mass spectrometer generates, what the raw data represents, what format/scale is used for the raw data, etc. In another embodiment, data mining logic analyzes the raw data 206 to determine the nature of the raw data 206. For example, data mining and/or data analysis logic may examine the format of the data, the time that the data was generated, the amount of fluctuation between the current raw data and other raw data that was generated within some predefined past period (e.g., within the past 30 seconds), the format/scale of the raw data (e.g., miles per hour), and ultimately determine that the raw data is describing wind speed and direction from an electronic weather vane.

However the data descriptor 209 is derived, its purpose is to provide meaningful context to the raw data. For example, the raw data 206 may be "90". The data descriptor 209 may be "wind speed". Thus, the context of the raw data 206 is now "hurricane strength wind".

Figure 3:
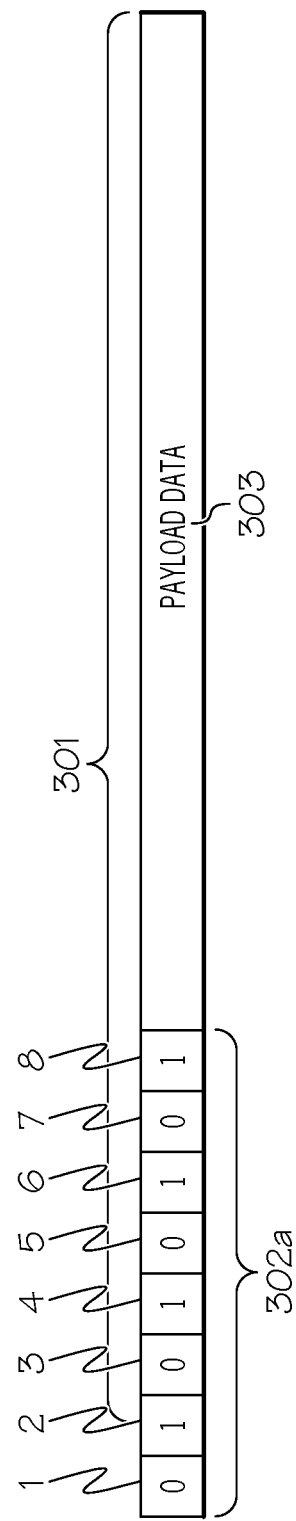
FIG. 3 presents an exemplary hashed data made up of a logical address and payload data in accordance with one embodiment of the present invention.

The hashing logic 208 utilizes the data descriptor 209 to generate a logical address at which the payload data from the raw data 206 will be stored. That is, using the data descriptor 209, the hashing logic generates a meaningful logical address that, in and of itself, describes the nature of the payload data (i.e., the raw data 206). For example, the logical address "01010101" may be reserved for hurricane strength wind readings. Thus, any data stored at an address that has "01010101" at some predefined position within the logical address (which may or may not be at the beginning of the logical address) is identified as being related to "hurricane strength wind readings". A memory storage vector describing such a logical address and payload data is shown in FIG. 3 as memory storage vector 301, which includes the logical address 302a (i.e., "01010101") and the payload data 303 (i.e., raw data 206).

As shown in FIG. 2, the logical address and payload data 210 are then sent to a logical-to-physical translation unit 212, which is hardware that translates logical addresses into physical addresses within available physical storage, such as random access memory (RAM), solid state drive (SSD) flash memory, hard disk drives, etc. This translation can be performed through the use of a lookup table, a physical address generator, or any other process known to those skilled in the art for generating physical addresses from logical addresses. (Note that a "logical address" is defined as an address at which a storage element appears to reside from the perspective of executing software, even though the "real" memory location in a physical device may be different.) The generated physical address (which was generated by the logical-to-physical translation unit 212), the logical address 218 (which was generated by the hashing logic 208), and the payload data (e.g., raw data 206) are all then sent to a load/store unit (LSU) 214, which stores the logical address 218 and the payload data in a physical storage device 216 at the generated physical address.

The logical address 218 is then sent to an exclusive OR (XOR) unit 220. XOR unit 220 is hardware logic that compares two vectors (i.e., strings of characters), and then presents a total count of how many bits at particular bit locations are different. For example, (0101) XOR (1010)=4, since the bit in each of the four bit locations is different. Similarly, (0101) XOR (0111)=1, since only the bit at the third bit location in the two vectors is different. These generated values (i.e., 4, 1) are known as "Hamming distances", which is defined as the total number of bit differences for all of the bit locations in a vector. Thus, the Hamming distance from "0101" to "1010" is 4; the Hamming distance from "0101" to "0111" is 1; the Hamming distance from "0101" to "0010" is 3; etc. Note that it is not the total number of "1"s or "0"s that is counted. Rather, it is the total number of different bits at the same bit location within the vector that is counted. That is, "0101" and "1010" have the same number of "1"s (2), but the Hamming distance between these two vectors is 4, as explained above.

XOR unit 220 then compares the logical address 218 (which was generated for the raw data 206 as just described) with another logical address 222, in order to generate the Hamming distance 224 between these two logical addresses. This Hamming distance 224, along with the other logical address 222, is then sent to a retrieval unit 226. If the Hamming distance 224 is below some predetermined value/limit, then the retrieval unit 226 retrieves the other payload data 228 that is stored at the other logical address 222. In actual practice, the other payload data 228 is stored at a physical address that is associated with that other logical address 222. That is, the retrieval unit 226 is able to utilize the logical-to-physical translation unit 212 to derive the physical address that is associated with the other logical address 222. By retrieving the other payload data 228, the raw data 206 and the other payload data 228 are then associated with one another, since their closely related logical addresses indicate that other payload data 228 and the raw data 206 both describe a same type of event, activity, condition, etc.

As described in FIG. 2, two payload data are associated with one another if their respective logical addresses are within some predetermined Hamming distance to each other. That is, the two logical addresses need not be the exact same logical address. Rather, just being "similar" is enough to associate their respective payloads together. The reason for this is due to a combination of unique properties held by logical addresses that are over a certain number of bits (e.g., between 1,000 and 10,000 bits in length) and statistical probability.

For example, consider two logical addresses that are each 1,000 bits long. Out of these 1,000 bits, only a small percentage of the bit (e.g., 4 bits out of the 1,000) are "significant bits". The term "significant bits" is defined as those bits at specific bit locations in a logical address that provide a description, such as metadata, that describes a feature of the event represented by the payload data stored at that logical address. For example, in the logical address vector 302a shown in FIG. 3, the "1" bits found in bit locations 2, 4, 6, 8 of logical address vector 302a are the "significant bits" that describe what the payload data 303 shown in the memory vector 301 in FIG. 3 represents. Thus, the other four bits in the bit locations 1, 3, 5, 7 are "insignificant", since they have nothing to do with describing the payload data 303. If the logical address vector 302a was 1,000 bits long, instead of just 8 bits long, then the 996 bits in the rest of the logical address vector would be insignificant. Thus, two logical addresses could both describe a same type of payload data, even if the Hamming distance between them was very large.

In order to filter out logical addresses that are unrelated, different approaches can be used. One approach is to simply mask in only those addresses that contain the "significant bits". This allows a precise collection of related data, but is relatively slow.

Another approach to determining which logical addresses are actually related is to develop a cutoff value for the Hamming distance based on historical experience. This historical experience is used to examine past collections of data, from which the Hamming distance between every pair of logical addresses (which were generated by the hashing logic 208 shown in FIG. 2) is used to determine where the "break point" is. For example, assume that this historical analysis shows that logical address pairs (who use 1,000 bit addresses) that are within a Hamming distance of 10 contain the same type of data 99.99% of the time; logical address pairs that are within a Hamming distance of 50 contain the same type of data 95% of the time; and logical address pairs that are within a Hamming distance of 500 contain the same type of data 80% of the time. Based on the level of precision required, the appropriate Hamming distance is then selected for future data collection/association.

Once the cutoff value for the Hamming distance between two logical addresses is determined (using statistics, historical experience, etc.), the probability that two logical addresses are actually related can be fine-tuned using a Bayesian probability formula. For example, assume that A represents the event that two logical addresses both contain the same significant bits that describe a same attribute of payload data stored at the two logical addresses, and B represents the event that the Hamming distance between two logical addresses is less than a predetermined number (of bit differences), as predetermined using past experience, etc. This results in the Bayesian probability formula of:

$$P(A \mid B) = \frac{P(B \mid A)P(A)}{P(B)}$$

where: P(A|B) is the probability that two logical addresses both contain the same significant bits that describe a same attribute of payload data stored at the two logical addresses (A) given that (|) the Hamming distance between two logical addresses is less than a predetermined number (B); P(B|A) is the probability that the Hamming distance between two logical addresses is less than a predetermined number given that (I) the two logical addresses both contain the same significant bits that describe a same attribute of payload data stored at the two logical addresses; P(A) is the probability that two logical addresses both contain the same significant bits that describe a same attribute of payload data stored at the two logical addresses regardless of any other information; and P(B) is the probability that the Hamming distance between two logical addresses is less than a predetermined number regardless of any other information.

For example, assume that either brute force number crunching (i.e., examining thousands/millions of logical addresses) and/or statistical analysis (e.g., using a cumulative distribution formula, a continuous distribution formula, a stochastic distribution statistical formula, etc.) has revealed that there is a 95% probability that two logical addresses that are less than 500 Hamming bits apart will contain the same significant bits (i.e., (P(B|A)=0.95). Assume also that similar brute force number crunching and/or statistical analysis reveals that in a large sample, there is a 99.99% probability that at least two logical addresses will both contain the same significant bits regardless of any other information (i.e., P(A)=0.9999). Finally, assume that similar brute force number crunching and/or statistical analysis reveals that two particular logical addresses are less than 500 bits apart regardless of any other information (i.e., P(B)=0.98). In this scenario, the probability that two logical addresses both contain the same significant bits, which describe a same attribute of payload data stored at the two logical addresses given that that the Hamming distance between two logical addresses is less than a predetermined number (i.e., P(A|B)) is 97%:

$$P(A \mid B) = \frac{0.95 * 0.9999}{0.98} = 0.97$$

However, assume now that such brute force number crunching and/or statistical analysis reveals that there is only an 80% probability that two logical addresses that are less than 500 Hamming bits apart will contain the same significant bits (i.e., (P(B|A)=0.80). Assuming all other values remain the same (i.e., P(A)=0.9999 and P(B)=0.98), then probability that two logical addresses both contain the same significant bits, which describe a same attribute of payload data stored at the two logical addresses given that that the Hamming distance between two logical addresses is less than a predetermined number (i.e., P(A|B)), is now 81%:

$$P(A \mid B) = \frac{0.80 * 0.9999}{0.98} = 0.81$$

Note the following features of this analysis. First, due to the large number of data entries (i.e., thousands or millions or more), use cases and/or statistical analyses show that the probability that two logical addresses will both contain the same significant bits is high (e.g., 99.99%). Second, due to random matching (i.e., two bits randomly matching) combined with controlled matching (i.e., two bits match since they both describe a same attribute of the payload data), the probability that any two logical addresses are less than 500 bits apart is also high (e.g., 98%). However, because of these factors, P(A) is higher than P(B); thus P(A|B) will be higher than P(B|A).

Figure 4:
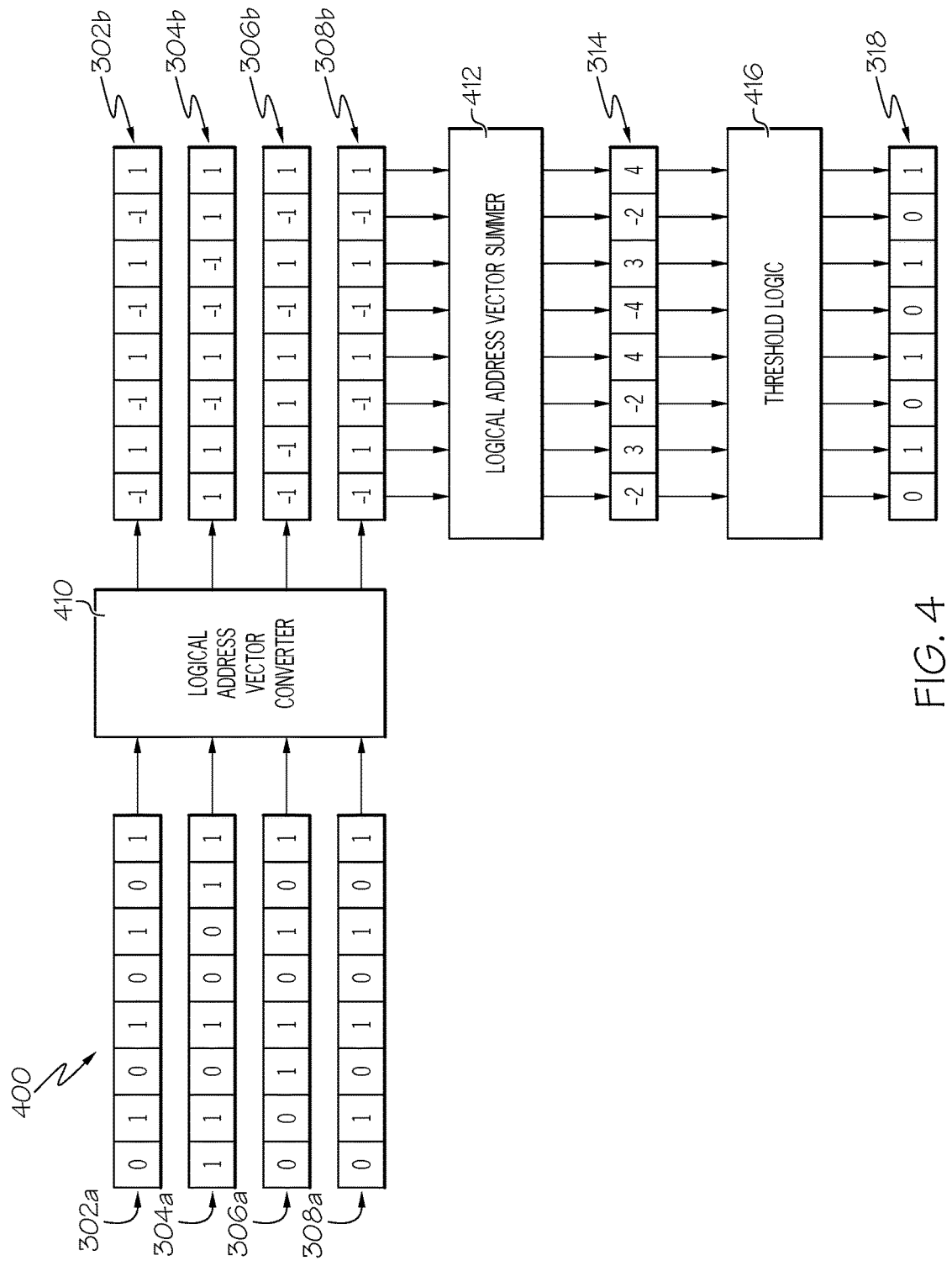
FIG. 4 depicts an exemplary system in which sets of logical addresses are evaluated to determine their relativity, according to one embodiment of the present invention.

With reference now to FIG. 4, in one embodiment, a determination is made that logical addresses from a particular set are or are not all related based on their summed logical addresses. For example, consider the system 400 shown in FIG. 4, in which sets of logical addresses are evaluated to determine their relativity (i.e., whether or not they all provide a logical address that describes related payload data). That is, logical addresses 302a-308a are logical addresses (that have been generated by the hashing procedure described above) for different payload data (not shown). In order to sum and compare these logical addresses, they are all first run though a logical address vector converter 410, which flips each "0" in the original logical addresses to a "−1", as depicted in converted logical addresses 302b-308b. These converted logical addresses 302b-308b are then summed in a logical address vector summer 412, which produces the summed address vector 314. Summed address vector 314 is a sum of each bit in each particular bit location in each of the converted logical addresses 302b-308b. For example, the first bit position in the converted logical addresses 302b-308b contains the values "−1", "+1", "−1" and "−1", which add up to "−2".

The summed address vector 314 is then run through a threshold logic 416, which compares each bit location sum to a threshold. In the example shown, this threshold states that any summed bit location that is positive is deemed to be a "1", while any summed bit location that is negative is deemed to be a "0", and any summed bit location that is zero is deemed to be either "0" or "1" (with a 50:50 chance of which one it is). As depicted, this threshold results in an evaluated logical address vector 318 of "01010101", which is the same as logical address 302a. If logical address 302a is the benchmark address (i.e., is the logical address that other addresses need to match in order to be hold the same type of payload data as logical address 302a), then matching 318 to 302a reveals that the set of logical addresses made up of 302b-308b all contain payload data that are "close enough" to that stored at logical address 302a. That is, even though logical addresses 304a and 306a are not exactly like logical address 302a (and thus may describe slightly different payload data), they are part of the same set of logical addresses 302a-308a (i.e., evaluated logical address vector 318 matches logical address 302a), and thus are deemed to have payload data that is related the payload data that is stored at logical address 302a. This assumption may be based on several factors. First, the misaligned bit positions (i.e., those that have different bit values) may or may not be significant. Second, even if the misaligned bit positions are all significant, they may not describe a particular characteristic that is important to a particular analysis. For example, a bit may simply describe a color of a product being sold, which is insignificant to a financial analysis of sales at a particular store. Third, even if the bits are significant at all requisite levels, the fact that enough (½ in the example shown in FIG. 4) of the address vectors match up perfectly may be enough to provide a meaningful group of logical addresses (i.e., there are enough exactly matching logical addresses in the group to provide a significant group, which can be utilized for some other purposes such as trend analysis, etc.).

Figure 5:
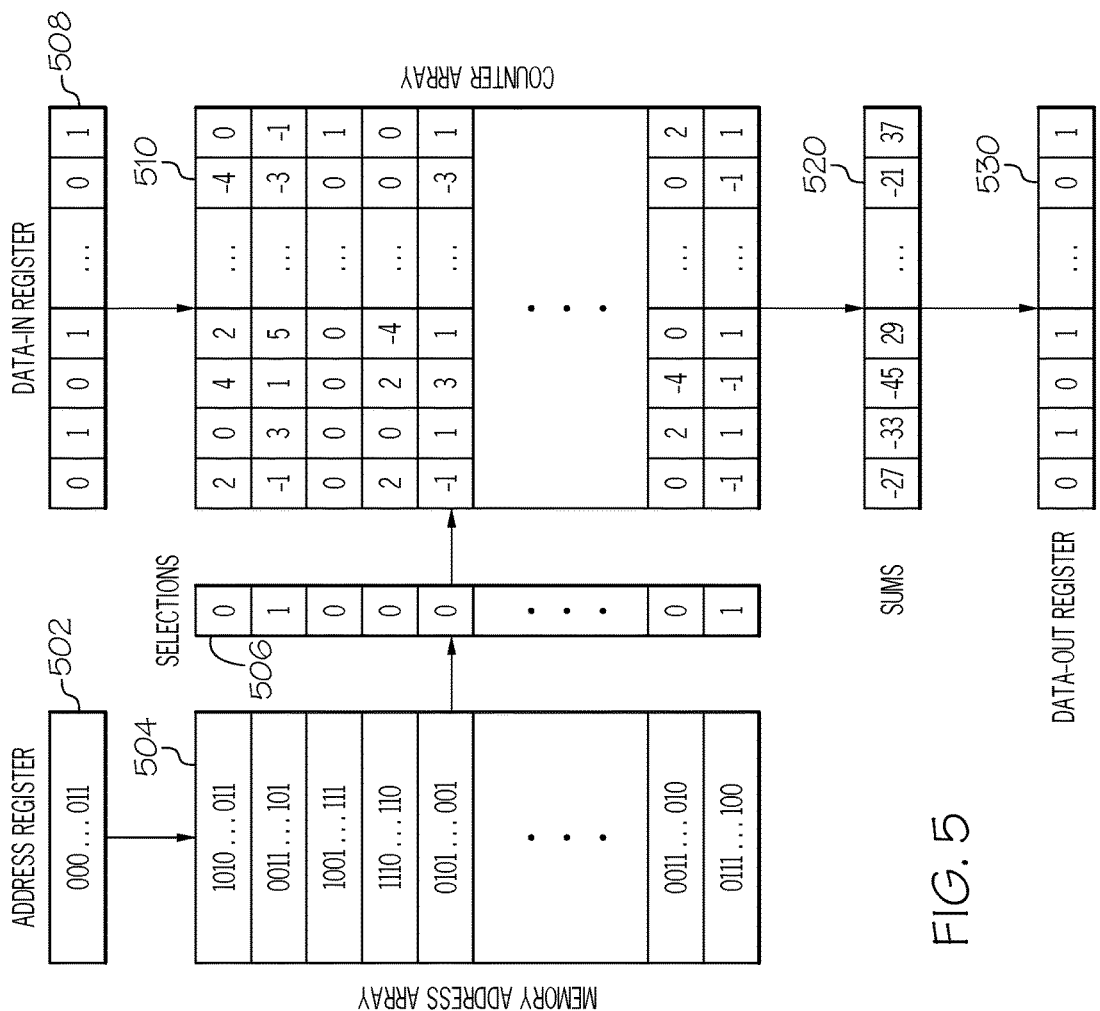
FIG. 5 depicts an exemplary sparse distributed memory system providing additional details not shown in FIG. 4, according to one embodiment of the present invention.

Turning now to FIG. 5, depicts an exemplary sparse distributed memory system providing additional details not shown in FIG. 4, according to one embodiment of the present invention. This schematic diagram shows the relations among the components of sparse distributed memory. The address register 502 is used to index into memory array 504. The memory in this example stores and retrieves 256-bit patterns across 2,000 physical locations. Each horizontal row is a location. The input pattern (cue) in the address register 502 is compared simultaneously to all 2,000 patterns in the memory address array; each line in the array holds the address of one location. The distances from each address pattern are compared with the memory's built-in threshold radius and a subset of the locations is selected in the shaded areas of 506. The 256-bit data pattern is stored at the selected locations by adding 1 to each counter in the counter array 510 corresponding to each 1 in the pattern and subtracting 1 from each counter corresponding to a 0 in the pattern. The data-in register 508 is used to search the counter-array 510. A 256-bit pattern is retrieved by forming 256 sums 520 from the corresponding counters in each selected location and then forming a 1 output bit in the data-out register 530 for each sum that is nonnegative and a 0 for each sum that is negative. The retrieved pattern is a statistical reconstruction determined from the contents of all selected locations. All selections can be done in parallel, and all data bits can be handled in parallel, giving the memory great speed over a wide range of pattern widths and physical locations.

High-Level Flow

Figure 6:
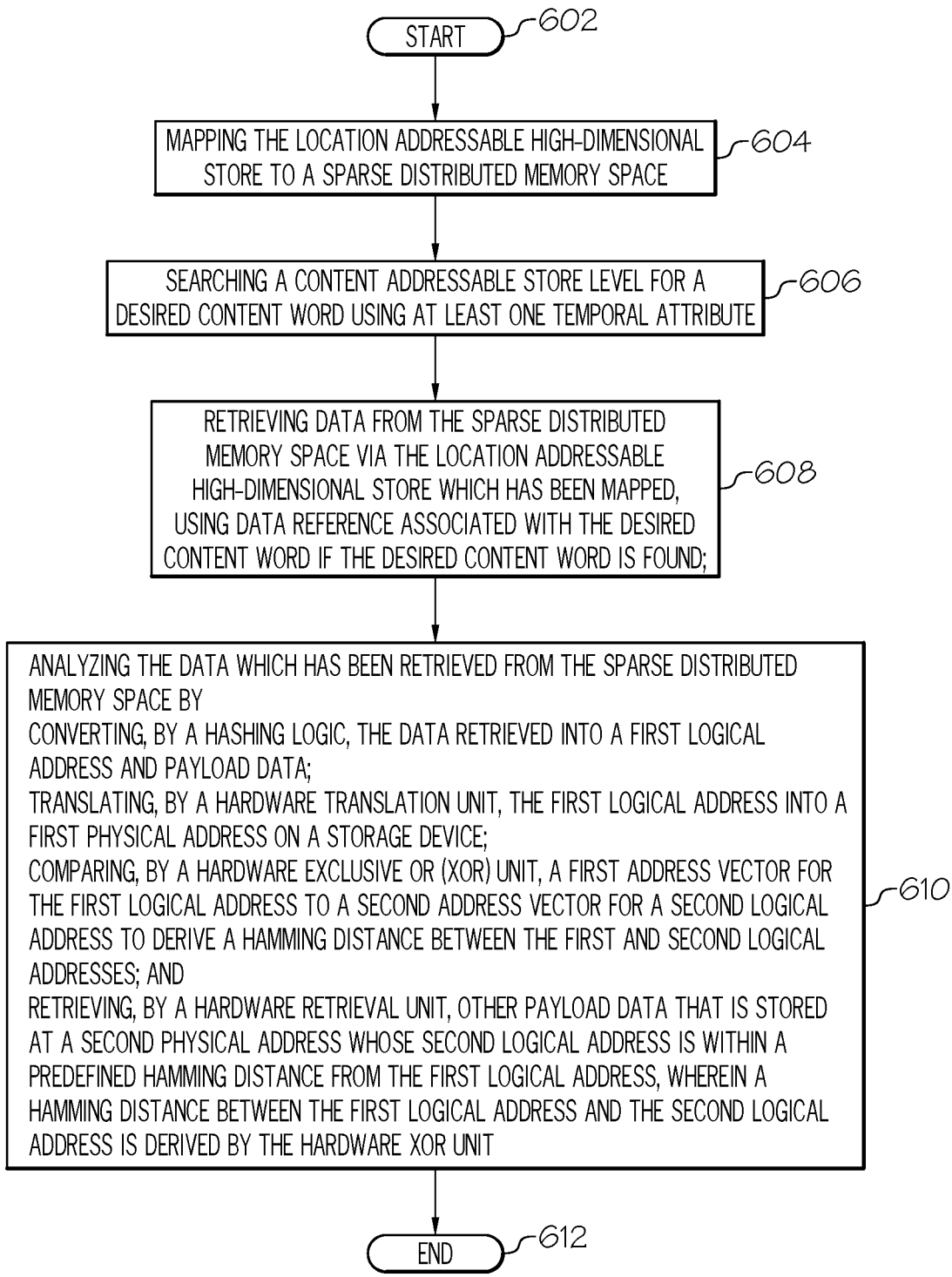
FIG. 6 is a high-level flow chart of one or more steps performed by one or more processors to retrieve and analyze stored data, according to one embodiment of the present invention.

With reference now to FIG. 6, a high-level flow chart of one or more steps performed by one or more processors to retrieve and analyze stored data, according to one embodiment of the present invention, is presented. The method is for retrieving data from a content addressable memory system. The content addressable system has a location addressable high-dimensional store and two or more of content addressable store levels each. Each content word is associated with a reference to data in the location addressable high dimensional store, The process begins in step 602 and immediately proceeds to step 604, in which the location addressable high-dimensional store is mapped to a sparse distributed memory space. Next in step 606, a content addressable store level is searched for a desired content word using at least one temporal attribute. The data is retrieved from the sparse distributed memory space via the location addressable high-dimensional store which has been mapped, using data reference associated with the desired content word if the desired content word is found in step 608. The retried data from the sparse memory space is analyzed in step 610. The analyzing includes: 1) converting, by a hashing logic, the data retrieved into a first logical address and payload data; 2) translating, by a hardware translation unit, the first logical address into a first physical address on a storage device; 3) comparing, by a hardware exclusive OR (XOR) unit, a first address vector for the first logical address to a second address vector for a second logical address to derive a Hamming distance between the first and second logical addresses; and 4) retrieving, by a hardware retrieval unit, other payload data that is stored at a second physical address whose second logical address is within a predefined Hamming distance from the first logical address, wherein a Hamming distance between the first logical address and the second logical address is derived by the hardware XOR unit. The process ends in step 612.

As depicted in FIG. 4, in one embodiment the process further comprises converting, by an address vector converter, each zero bit in a set of address vectors that describe a set of physical addresses to a negative one bit to generate a set of converted address vectors. An address vector summer then sums each bit position from the set of address vectors to generate a summation address vector. A threshold logic then compares the summation address vector to the first physical address, where a group of physical addresses whose summed address vector matches the first physical address is determined to address a storage location of a same class of payload data.

In one embodiment, the process depicted in FIG. 4 uses the hardware XOR unit to generate a Hamming distance between the first logical address and all logical addresses within the group of logical addresses whose summed address vector matches the first logical address. This enables the hardware retrieval unit to retrieve other payload data, stored within the group of physical addresses that correspond to the group of logical addresses whose summed address vector matches the first logical address, that are stored at a physical address whose corresponding logical address is within the predefined Hamming distance from the first logical address.

In various embodiments of the present invention, the payload data contains data about various events, including, but not limited to, a quantitative description of commercial transactions (e.g., how many units are sold); a qualitative description of commercial transactions (e.g., how much the units cost, what color of units were sold, etc.); an entity (e.g., a medical patient, such that the payload data describes the medical condition of the patient based on laboratory results, etc.); etc.

Non-Limiting Examples

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of various embodiments of the present invention has been presented for purposes of illustration and description, but is not intended to be exhaustive or limited to the present invention in the form disclosed. Many modifications and variations will be apparent to those of ordinary skill in the art without departing from the scope and spirit of the present invention. The embodiment was chosen and described in order to best explain the principles of the present invention and the practical application, and to enable others of ordinary skill in the art to understand the present invention for various embodiments with various modifications as are suited to the particular use contemplated.

Note further that any methods described in the present disclosure may be implemented through the use of a VHDL (VHSIC Hardware Description Language) program and a VHDL chip. VHDL is an exemplary design-entry language for Field Programmable Gate Arrays (FPGAs), Application Specific Integrated Circuits (ASICs), and other similar electronic devices. Thus, any software-implemented method described herein may be emulated by a hardware-based VHDL program, which is then applied to a VHDL chip, such as a FPGA.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium is any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

What is claimed is:

1. A memory system, comprising:
    a location addressable high-dimensional store having data identified by location;
    a plurality of content addressable stores each having content words, each content word being associated with a reference to data in the location addressable high-dimensional store;
    a mapping unit that maps the location addressable high-dimensional store to a sparse distributed memory space;
    search word register for searching a content addressable store level for a desired content word using at least one temporal attribute within a Hamming space;
    sparse memory retrieval unit that uses the desired content word to retrieve data from the sparse distributed memory space via the location addressable high-dimensional store which has been mapped;
    comparison unit to execute instructions to analyze the data which has been retrieved from the sparse distributed memory space by
        a hashing logic, wherein the hashing logic executes instructions to convert the data which has been retrieved from the sparse distributed memory space into a first logical address and payload data, wherein the first logical address describes metadata about the payload data;
        a hardware translation unit, wherein the hardware translation unit executes instructions to translate the first logical address into a first physical address on a storage device;
        a hardware load/storage unit, wherein the hardware load/storage unit stores the first logical address and the payload data at the first physical address on the storage device;
        a hardware exclusive OR (XOR) unit, wherein the hardware XOR unit compares two logical address vectors to derive a Hamming distance between the two logical address vectors; and
        a hardware retrieval unit, wherein the hardware retrieval unit retrieves other payload data that is stored at a second physical address whose second logical address is within a predefined Hamming distance within the Hamming space from the first logical address, and wherein a Hamming distance between the first logical address and the second logical address is derived by the hardware XOR unit.

2. The system of claim 1, further comprising: an address vector converter, wherein the address vector converter is hardware that converts each "zero" bit in an address vector to a "negative one" bit to generate a converted address vector; an address vector summer, wherein the address vector summer is hardware that sums each bit position from two or more address vectors to generate a summation address vector; and a threshold logic, wherein the threshold logic compares the summation address vector to the first logical address, wherein a group of logical addresses whose summation address vector matches the first logical address is determined to address a storage location of a same class of payload data.

3. The system of claim 2, wherein the hardware XOR unit generates a Hamming distance between the first logical address and all logical addresses within the group of logical addresses whose summation address vector matches the first logical address, and wherein the hardware retrieval unit retrieves other payload data that are stored within a group of physical addresses that correspond to the group of logical addresses whose summation address vector matches the first logical address.

4. The system of claim 1, wherein the payload data quantitatively describes a commercial transaction.

5. The system of claim 1, wherein the payload data qualitatively describes a commercial transaction.

6. The system of claim 1, wherein the payload data qualitatively describes an entity.

7. The system of claim 1, wherein the hashing logic comprises one or more processors executing the instructions to convert the data which has been retrieved into the first logical address and the payload data.

8. A method for retrieving data from a content addressable memory system having a location addressable high-dimensional store and a plurality of content addressable store levels each is associated with a reference to data in the location addressable high-dimensional store, the method comprising:
    mapping the location addressable high-dimensional store to a sparse distributed memory space;
    searching a content addressable store level for a desired content word using at least one temporal attribute within a Hamming space;
    retrieving data from the sparse distributed memory space via the location addressable high-dimensional store which has been mapped, using data reference associated with the desired content word if the desired content word is found; and
    analyzing the data which has been retrieved from the sparse distributed memory space by
        converting, by a hashing logic, the data retrieved into a first logical address and payload data;
        translating, by a hardware translation unit, the first logical address into a first physical address on a storage device;
        comparing, by a hardware exclusive OR (XOR) unit, a first address vector for the first logical address to a second address vector for a second logical address to derive a Hamming distance between the first and second logical addresses; and
        retrieving, by a hardware retrieval unit, other payload data that is stored at a second physical address whose second logical address is within a predefined Hamming distance within the Hamming space from the first logical address, wherein a Hamming distance between the first logical address and the second logical address is derived by the hardware XOR unit.

9. The method of claim 8, further comprising: converting, by an address vector converter, each "zero" bit in an address vector to a "negative one" bit to generate a converted address vector; summing, by an address vector summer, each bit position from two or more address vectors to generate a summation address vector; and comparing, by a threshold logic, the summation address vector to the first logical address, wherein a group of logical addresses whose summation address vector matches the first logical address is determined to address a storage location of a same class of payload data.

10. The method of claim 9, wherein the hardware XOR unit generates a Hamming distance between the first logical address and all logical addresses within the group of logical addresses whose summation address vector matches the first logical address, and wherein the hardware retrieval unit retrieves other payload data that are stored within a group of physical addresses that correspond to the group of logical addresses whose summation address vector matches the first logical address.

11. The method of claim 8, wherein the payload data quantitatively describes a commercial transaction.

12. The method of claim 8, wherein the payload data qualitatively describes a commercial transaction.

13. The method of claim 8, wherein the payload data qualitatively describes an entity.

14. The method of claim 8, wherein the hashing logic comprises one or more processors executing instructions to convert the data which has been retrieved into the first logical address and the payload data.

15. A computer program product for retrieving data from a content addressable memory system having a location addressable high-dimensional store and a plurality of content addressable store levels each is associated with a reference to data in the location addressable high-dimensional store, the product having a computer readable non-transitory storage medium comprising program code operable for:

mapping the location addressable high-dimensional store to a sparse distributed memory space;

searching a content addressable store level for a desired content word using at least one temporal attribute within a Hamming space;

retrieving data from the sparse distributed memory space via the location addressable high-dimensional store which has been mapped, using data reference associated with the desired content word if the desired content word is found; and analyzing the data which has been retrieved from the sparse distributed memory space by converting, by a hashing logic, the data retrieved into a first logical address and payload data;

translating, by a hardware translation unit, the first logical address into a first physical address on a storage device;

comparing, by a hardware exclusive OR (XOR) unit, a first address vector for the first logical address to a second address vector for a second logical address to derive a Hamming distance between the first and second logical addresses; and retrieving, by a hardware retrieval unit, other payload data that is stored at a second physical address whose second logical address is within a predefined Hamming distance within the Hamming space from the first logical address, wherein a Hamming distance between the first logical address and the second logical address is derived by the hardware XOR unit.

16. The computer program product of claim 15, further comprising: converting, by an address vector converter, each "zero" bit in an address vector to a "negative one" bit to generate a converted address vector; summing, by an address vector summer, each bit position from two or more address vectors to generate a summation address vector; and comparing, by a threshold logic, the summation address vector to the first logical address, wherein a group of logical addresses whose summation address vector matches the first logical address is determined to address a storage location of a same class of payload data.

17. The computer program product of claim 16, wherein the hardware XOR unit generates a Hamming distance between the first logical address and all logical addresses within the group of logical addresses whose summation address vector matches the first logical address, and wherein the hardware retrieval unit retrieves other payload data that are stored within a group of physical addresses that correspond to the group of logical addresses whose summation address vector matches the first logical address.

18. The computer program product of claim 15, wherein the payload data quantitatively describes a commercial transaction.

19. The computer program product of claim 15, wherein the payload data qualitatively describes a commercial transaction.

20. The computer program product of claim 15, wherein the payload data qualitatively describes an entity.

* * * * *